(12) United States Patent
Noguchi

(10) Patent No.: US 8,947,414 B2
(45) Date of Patent: Feb. 3, 2015

(54) ACTIVE MATRIX SUBSTRATE AND ORGANIC EL DISPLAY DEVICE

(75) Inventor: Noboru Noguchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 191 days.

(21) Appl. No.: 13/381,336

(22) PCT Filed: Apr. 2, 2010

(86) PCT No.: PCT/JP2010/056067
§ 371 (c)(1), (2), (4) Date: Dec. 28, 2011

(87) PCT Pub. No.: WO2011/001728
PCT Pub. Date: Jan. 6, 2011

(65) Prior Publication Data
US 2012/0120045 A1     May 17, 2012

(30) Foreign Application Priority Data
Jul. 1, 2009    (JP) ................................. 2009-156970

(51) Int. Cl.
    *G09G 3/32*       (2006.01)
    *H01L 27/32*      (2006.01)

(52) U.S. Cl.
CPC ...... *G09G 3/3233* (2013.01); *G09G 2300/0819* (2013.01); *G09G 2300/0852* (2013.01);
(Continued)

(58) Field of Classification Search
None
See application file for complete search history.

(56) References Cited

U.S. PATENT DOCUMENTS

2002/0000551 A1    1/2002    Yamazaki et al.
2003/0059986 A1    3/2003    Shibata
(Continued)

FOREIGN PATENT DOCUMENTS

JP     2001-326362 A     11/2001
JP     2003-168570 A     6/2003
(Continued)

OTHER PUBLICATIONS

International Search Report received for PCT Patent Application No. PCT/JP2010/056067, mailed on Jul. 6, 2010, 7 pages (3 pages of English translation and 4 pages of PCT search report).

*Primary Examiner* — Jonathan Boyd
*Assistant Examiner* — Sardis Azongha
(74) *Attorney, Agent, or Firm* — Morrison & Foerster LLP

(57) ABSTRACT

The present invention provides an active matrix substrate and an organic EL display device in which reduction in the response rate of a current-driven light-emitting element is suppressed. The active matrix substrate of the present invention is an analog gradation-driving active matrix substrate, including multiple pixels each including a current-driven light-emitting element and a drive transistor. The current-driven light-emitting element includes a pixel electrode electrically coupled with the drive transistor. The drive transistor supplies a current to the current-driven light-emitting element through the pixel electrode. The multiple pixels include a first pixel and a second pixel disposed adjacent to each other. A gate electrode of the drive transistor of the first pixel is disposed between the pixel electrode of the current-driven light-emitting element of the first pixel and the pixel electrode of the current-driven light-emitting element of the second pixel in a plan view of a main face of the substrate.

13 Claims, 14 Drawing Sheets

(52) U.S. Cl.
  CPC .......... *G09G2300/0861* (2013.01); *G09G 2320/0252* (2013.01); *G09G 2320/043* (2013.01); *H01L 27/3262* (2013.01); *G09G 2320/0214* (2013.01)
  USPC .......... 345/211; 257/40; 257/59; 257/72; 315/169.3; 438/99

(56) References Cited

U.S. PATENT DOCUMENTS

| | | | |
|---|---|---|---|
| 2003/0089905 A1 | 5/2003 | Udagawa et al. | |
| 2003/0132927 A1 | 7/2003 | Ishihara et al. | |
| 2003/0155612 A1 | 8/2003 | Kawachi et al. | |
| 2003/0222589 A1 | 12/2003 | Osame et al. | |
| 2004/0206974 A1* | 10/2004 | Yamazaki et al. | 257/98 |
| 2005/0017934 A1 | 1/2005 | Chung et al. | |
| 2005/0190130 A1 | 9/2005 | Ishihara et al. | |
| 2005/0231122 A1 | 10/2005 | Osame et al. | |
| 2005/0247940 A1 | 11/2005 | Shibata et al. | |
| 2006/0066530 A1* | 3/2006 | Azami et al. | 345/76 |
| 2006/0108916 A1 | 5/2006 | Koo et al. | |
| 2007/0080918 A1 | 4/2007 | Kawachi et al. | |
| 2007/0120118 A1* | 5/2007 | Kubota et al. | 257/40 |
| 2007/0188089 A1 | 8/2007 | Choi et al. | |
| 2007/0200139 A1 | 8/2007 | Shibata et al. | |
| 2007/0246777 A1 | 10/2007 | Yamazaki et al. | |
| 2008/0036704 A1 | 2/2008 | Kim et al. | |
| 2008/0062095 A1 | 3/2008 | Park et al. | |
| 2008/0170005 A1 | 7/2008 | Osame et al. | |
| 2009/0009440 A1 | 1/2009 | Kawachi et al. | |
| 2009/0078939 A1* | 3/2009 | Yamazaki et al. | 257/59 |
| 2009/0121982 A1 | 5/2009 | Choi et al. | |
| 2009/0305490 A1* | 12/2009 | Sera | 438/527 |
| 2010/0224868 A1 | 9/2010 | Udagawa et al. | |
| 2011/0012198 A1 | 1/2011 | Yagi | |
| 2012/0181540 A1 | 7/2012 | Udagawa et al. | |
| 2013/0087775 A1 | 4/2013 | Udagawa et al. | |
| 2013/0248892 A1 | 9/2013 | Osame et al. | |

FOREIGN PATENT DOCUMENTS

| | | |
|---|---|---|
| JP | 2003-229578 A | 8/2003 |
| JP | 2004-227870 A | 8/2004 |
| JP | 2005-31630 A | 2/2005 |
| JP | 2005-128574 A | 5/2005 |
| JP | 2006-30635 A | 2/2006 |
| JP | 2006-47999 A | 2/2006 |
| JP | 2007-041612 A | 2/2007 |
| JP | 2007-219517 | 8/2007 |
| JP | 2008-40451 A | 2/2008 |
| JP | 2009-21477 A | 1/2009 |
| KR | 10-2003-0061359 | 7/2003 |
| WO | WO 2009133388 A1 * | 11/2009 |

* cited by examiner

US 8,947,414 B2

ACTIVE MATRIX SUBSTRATE AND ORGANIC EL DISPLAY DEVICE

CROSS REFERENCE TO RELATED APPLICATIONS

This application is a U.S. National Phase patent application of PCT/JP2010/056067, filed Apr. 2, 2010, which claims priority to Japanese patent application Serial No. 2009-156970, filed Jul. 1, 2009, each of which is hereby incorporated by reference in the present disclosure in its entirety.

TECHNICAL FIELD

The present invention relates to an active matrix substrate and an organic EL display device. The present invention specifically relates to an active matrix substrate suitable for display devices that are equipped with current-driven light-emitting elements such as organic EL elements, and an organic EL display device comprising the same.

BACKGROUND ART

There are two modes for driving organic EL display devices, namely, the passive matrix mode and the active matrix mode. The active matrix mode is being the leading mode among the driving modes. This trend is particularly remarkable in the field of large-size display devices.

In general, pixels of active matrix organic EL display devices each have, for each organic EL element, a switching transistor for transmitting data signals and a drive transistor for driving an organic EL element in response to each data signal transmitted by the switching transistor (for example, see Patent Document 1). There occurs parasitic capacitance between these members disposed on each pixel and wiring layers such as a scanning line and a signal line. In order to suppress display failure called crosstalk due to this parasitic capacitance, a method is disclosed in which an electric field pattern is disposed so as to serve as an electric field shield for a scanning line and a signal line (for example, see Patent Document 2).

If the drive transistors of the respective pixels are driven by the same gate voltage even though the drive transistors of the respective pixels have different threshold voltages, current values supplied from the drive transistors to the organic EL elements vary, resulting in non-uniform display. In order to solve this problem, methods are known in which area-gradation expression or time-division-gradation expression is performed based on digital gradation driving. In the case of analog gradation driving, a method is disclosed in which variations in the threshold voltages of the drive transistors are detected and a so-called compensation circuit, which compensates for the variations, is formed in each pixel (for example, see Patent Document 3).

Patent Document 1: JP 2006-47999 A
Patent Document 2: JP 2006-30635 A
Patent Document 3: JP 2005-31630 A

SUMMARY OF THE INVENTION

FIG. 8 is a circuit diagram showing a pixel of a conventional organic EL display device having a compensation circuit. This pixel has six transistors (T1 to T6), two capacitors (C1 and C2), and one organic EL element OLED. In FIG. 8, scan[n−1] and scan[n] indicate the [n−1]th and [n]th scanning lines, respectively; Vini[n] indicates the [n]th voltage-initializing line; and em[n] indicates the [n]th light-emission-controlling line. The transistor T1 causes data signals stored in the capacitors C1 and C2 to be discharged via the voltage-initializing line Vini[n] in response to a scan signal input from the scanning line scan[n−1], and thereby initializes the gate voltage of the transistor T4. The transistor T2 compensates for inaccuracy in the threshold voltage of the transistors T4. The transistor T3 switches on/off data signals input from the signal line data in response to scan signals input from the scanning line scan[n]. The transistor T4 determines the amperage for supplying a current to the organic EL element OLED in response to data signals input through the transistor T3. The transistor T5 switches on/off a current supplied from the power-source line ELVDD to the transistor T4 in response to light-emitting signals input from the light-emission-controlling line em[n]. The transistor T6 switches on/off a current supplied from the transistor T4 to the organic EL element OLED in response to light-emitting signals input from the light-emission-controlling line em[n]. The capacitor C1 stores a gate voltage input to the transistor T4. The capacitor C2 assists the capacitor C1. The organic EL element OLED emits light in response to a current supplied from the transistor T4. The anode of the organic EL element OLED is coupled with a drain of the transistor T6, and the cathode of the organic EL element OLED is coupled with the power-source line ELVSS.

Here, the positional relationship of the respective components of the pixel illustrated in the circuit diagram of FIG. 8 will be described referring to FIGS. 9 and 10. FIG. 9 is a schematic plan view showing the pixel of the conventional organic EL display device having a compensation circuit. FIG. 10 is a schematic cross-sectional view along the X1-X2 line in FIG. 9.

The scanning lines scan[n−1], scan[n], and scan[n+1], the light emission controlling line em[n], and the voltage-initializing line Vini are formed in the same layer (first wiring layer), and they extend in the transverse direction in FIG. 9. In the present description, the state that a layer A and a layer B are in the same layer means that at least the layer A and the layer B are in contact with the same lower layer, or the layer A and the layer B are in contact with the same upper layer. Further, the signal line data is formed in the second wiring layer, and it extends in a longitudinal direction in FIG. 9. In addition, the gate electrode 102 of the transistor T4 and the power-source line ELVDD are formed in both the first wiring layer and the second wiring layer via a contact hole, and they transfer from the first wiring layer to the second wiring layer at a portion overlapping the components such as the scanning lines disposed in the first wiring layer. In FIG. 10, only the portion formed in the second wiring layer of the gate electrode 102 is illustrated. The first wiring layer is disposed as a layer which is closer to a substrate 100 than the second wiring layer.

Each region defined by the scanning line scan[n−1], scanning line scan[n+1], power-source line ELVDD, and signal line data is provided with one pixel electrode 103 serving as an anode of the organic EL element OLED. This region functions as one pixel. On each pixel, the semiconductor layers 101 of the transistors T1 to T6 and the gate electrode 102 of the transistor T4 are disposed. The region represented as A is an opening portion of the pixel region serving as a display region of the organic EL display device.

As shown in FIG. 10, an interlayer insulating layer 110, a first electrode (the portion formed in the first wiring layer of the power-source line ELVDD), an interlayer insulating layer 111, and an interlayer insulating layer 112 are stacked in this order from the substrate 100 side. The semiconductor layer 101 is disposed between the substrate 100 and the interlayer insulating layer 110. The first electrode is disposed between the interlayer insulating layer 110 and the interlayer insulating layer 111. Second electrodes (the gate electrode 102 and the portion formed in the second wiring layer of the power-source line ELVDD) and the signal line data are formed between the interlayer insulating layer 111 and the interlayer insulating layer 112. The pixel electrode 103 is formed on the interlayer insulating layer 112. Edge portions of the pixel electrode 103 are covered with edge covers 113. The edge covers 113 cover the edge periphery of the pixel electrode 103, so that they prevent a short circuit between the pixel electrode 103 and the cathode (power-source line ELVSS) disposed opposite to the pixel electrode 103 via the organic EL layer. The portion not covered with the edge covers 113 of the pixel electrode 103 functions as the display region A.

FIG. 11 is a schematic plan view showing a positional pattern of the pixels shown in FIG. 9. FIG. 11 illustrates only the pixel electrodes 103 and the gate electrodes 102 of the transistors T4. As shown in FIG. 11, the organic EL display device has a structure such that multiple pixels are aligned.

In the observation about responses between tones in the organic EL display device described referring to FIGS. 8 to 11, the frame (one frame has a display duration of 16.7 ms) immediately after tones are changed does not achieve intended brightness and the following frames achieve the intended brightness; that is, stepwise responses are observed.

FIG. 12 is a graph illustrating the measurement result of the response characteristics of the conventional organic EL display device having a compensation circuit. FIG. 12 shows the result in the case of changing the display from black to white. As shown in FIG. 12, the frame immediately after changing the display from black to white shows very lower brightness than the following frames. This result means that the response time (the time the brightness requires to reach 90% or higher of the brightness to be intrinsically achieved) is longer than the duration of one frame. If the response time is longer than the duration of one frame, unnecessary linear patterns called "caudate afterimage" are visually observed when a displayed material is scrolled (moving images are displayed), resulting in deterioration of display performance. Thus, the conventional organic EL display device having a compensation circuit does not achieve rapid response characteristics which the organic EL element can originally achieve, and therefore can be further improved in the above respect.

The present invention is made under the above situation, and aims to provide an analog gradation-driving active matrix substrate suppressing reduction in the response time of the current-driven light-emitting element and an organic EL display device.

The present inventor has performed various studies on an analog gradation-driving active matrix substrate suppressing reduction in the response time of the current-driven light-emitting element, and has focused on the region where the pixel electrode of the current-driven light-emitting element and the gate electrode of the transistor (drive transistor) for driving the current-driven light-emitting element overlap with each other. Since the route of a current supplied from the drive transistor to the current-driven light-emitting element is preferably as short as possible, the current-driven light-emitting element and the drive transistor are disposed close to each other in many cases. Further, in order to form the light-emitting region as large as possible, the area ratio of the pixel electrode is set large, in general. Because of these reasons, the pixel electrode of the current-driven light-emitting element and the gate electrode of the drive transistor are disposed in an overlapping manner in many cases, and thus parasitic capacitance is likely to occur. Especially in the case of the pixel having a compensation circuit, many components are disposed in the pixel and the layout of the components is complicated. Thus, the region where the pixel electrode of the current-driven light-emitting element overlaps the gate electrode of the drive transistor is likely to be large. In the case that the compensation circuit comprises multiple transistors as in the organic EL display device shown in FIGS. 8 to 11, the pixel electrode of the current-driven light-emitting element may cover the whole of the gate electrode of the drive transistor. In the organic EL display device shown in FIGS. 8 to 11, parasitic capacitance (hereinafter, referred to as Cad) occurs between the gate electrode 102 of the transistor T4 (drive transistor) and the pixel electrode 103 (anode) of the organic EL element OLED. The present inventor has considered that this Cad caused the stepwise responses in the measurement result shown in FIG. 12.

In order to confirm the above study results, the simulations about response waveforms at different Cads were performed on the organic EL display device shown in FIGS. 8 to 11. FIGS. 13, 14, and 15 are graphs of the response waveforms of currents obtained in the simulations wherein the Cads are 0, 20, and 60 fF, respectively.

As shown in FIGS. 13 to 15, no stepwise responses were observed at a Cad of 0 fF, while stepwise responses were observed at a Cad of 20 or 60 fF. The regions defined by dot lines in FIGS. 14 and 15 indicate the portions where stepwise responses occur. Further, the graphs show that the difference between the current value of the first frame and the current value of the second frame becomes greater as the Cad increases from 20 fF to 60 fF.

Based on the results of the simulations for the response waveforms, the relationship between a current supplied to the organic EL element and a Cad is evaluated. FIG. 16 is a graph showing the relationship between a current supplied to the organic EL element and a Cad. FIG. 16 also reflects the results of the simulations wherein the Cad is set to a value except 0, 20, and 60 fF. In FIG. 16, the "current ratio" on the vertical axis means a ratio between the current of the first frame and that of the third frame after the display is changed from black to white or a middle tone, and is a value obtained by dividing the average current value of the first frame by the average current value of the third frame.

The results shown in FIG. 16 prove that the current ratio tends to become small as the Cad increases. In other words, an increase in the Cad tends to cause an increase in the difference between the current of the first frame and the current of the third frame.

The brightness of the organic EL element is proportional to the current supplied from the drive transistor. In other words, the current ratio in FIG. 16 is equal to the ratio between the brightness of the first frame and that of the third frame. Thus, in order to make the response time shorter than the duration of one frame and to prevent occurrence of the stepwise response characteristics, the current ratio in FIG. 16 is required to be higher than 0.9. Based on the results shown in FIG. 16, the current ratio excesses 0.9 probably when the display is switched from black to white at a Cad of substantially lower than 20 fF, and probably when the display is switched from black to a middle tone at a Cad of substantially lower than 16 fF. In the organic EL display device shown in FIGS. 8 to 11, however, the current ratio is not higher than 0.9 and the response time is longer than the duration of one frame, as shown in FIG. 12.

The following will describe a method of driving the pixel shown in FIG. 8 and the reason why stepwise responses occur due to Cad. FIG. 17 is a timing chart at the first frame of the pixel shown in FIG. 8. In FIG. 17, displacement in the vertical direction indicates the change in a voltage of each wiring, while the lapse of time is presented from left to right. FIG. 17 is drawn in such a manner that the respective wirings vertically arranged are on the same horizontal time axis so that the voltages of the wirings at the same timing are easily compared. Further, in FIG. 17, Vgs indicates the gate voltage of the transistor T4.

In one frame, three periods: initializing period a, programming period b, and light-emitting period c, are contained in this order. The respective periods will be described hereinbelow.

First, in the initializing period a, the scanning line scan[n−1] is switched on, and an electric charge (data signal) stored in the capacitors C1 and C2 are discharged through the voltage-initializing line Vini[n]. As a result, the gate voltage of the transistor T4 is initialized.

Next, in the programming period b, the scanning line scan[n] is switched on, and the data of the tone input from the signal line data is written on the transistor T4. Thereby, the threshold voltage of the transistor T4 is compensated. At this time, the gate voltage of the transistor T4 is lower than the voltage (Vdata) input from the signal line data by the value equivalent to the threshold voltage (Vth) of the transistor T4. Further, an electric charge corresponding to the gate voltage of the transistor T4 is also stored in the capacitors C1 and C2.

Then, in the light-emitting period c, the light emission controlling line em[n] is switched on, and the current corresponding to the gate voltage of the transistor T4, that is, Vdata−Vth, is supplied to the organic EL element OLED. Thereby, the organic EL element OLED emits light.

The following will describe the relationship between the gate voltage of the transistor T4 and the current supplied from the transistor T4 to the organic EL element OLED. FIG. 18 is a schematic view showing the TFT characteristics of the transistor T4 (drive transistor). In FIG. 18, V8 (V) and V255 (V) indicate gate voltages (Vgs) of the transistor T4 at the 8th tone and the 255th tone, respectively.

In the programming period b, the threshold voltage of the transistor T4 is compensated, and the value Vdata−Vth is set to the gate voltage of the transistor T4. In the light-emitting period c, a current corresponding to the gate voltage of the transistor T4 is applied. When Vdata_1<Vdata_2, the gate voltage (Vgs) of the transistor T4 upon light emission indicates Vgs_1<Vgs_2. In other words, the gate voltage (Vgs) of the transistor T4 increases as a voltage (Vdata) input from the signal line data increases. As a result, the current value (Ids) becomes small. In the TFT characteristics shown in FIG. 18, Vgs_1 corresponds to V255 (V), and Vgs_2 corresponds to V8 (V).

The following will describe the reason why the Cad causes stepwise responses. When the light emission controlling line em[n] is switched on during the light-emitting period c in FIG. 17, the gate voltage (Vgs) of the transistor T4 rises by the width represented as α. This is presumably due to the capacity component of the organic EL element OLED itself. As the electric charge of the pixel electrode of the organic EL element OLED is not sufficiently removed during the period of displaying no image (the period during which the light emission controlling line em[n] is switched off), the Vgs of the transistor T4 is pushed up toward the direction of the voltage of the previous frame via the Cad, and the gate voltage (Vgs) of the transistor T4 shows a voltage different from its predetermined voltage when the light emission controlling line em[n] is switched on.

In contrast, in the following frames, the electric potential of the pixel electrode of the organic EL element OLED is an electric potential obtained by adding the pushed-up (or pushed-down) electric potential to the predetermined electric potential. Thus, the gate voltage (Vgs) of the transistor T4 is less likely to be affected by the previous frame than the first frame after tone switching, and shows a voltage closer to the predetermined gate voltage. As a result, the first frame and the next frame after tone switching show stepwise-response characteristics.

Therefore, in order to remove the stepwise-response characteristics, the Cad is required to be reduced. The present inventor has further studied on this respect, and has found the following. That is, disposition of the pixel electrode of the current-driven light-emitting element at an optimum position so as to reduce the area where the pixel electrode overlaps the gate electrode of the drive transistor or formation of an opening on the pixel electrode of the current-driven light-emitting element leads to reduction in the Cad, and thereby occurrence of the stepwise-response characteristics is suppressed. Thus, the present inventor has arrived at clear solving of the above problem, and has completed the present invention.

That is, one aspect of the present invention is an analog gradation-driving active matrix substrate (hereinafter, also referred to as the first active matrix substrate of the present invention), comprising multiple pixels each having a current-driven light-emitting element and a drive transistor, wherein the current-driven light-emitting element has a pixel electrode electrically coupled with the drive transistor; the drive transistor supplies a current to the current-driven light-emitting element through the pixel electrode; the multiple pixels include a first pixel and a second pixel disposed adjacent to each other; and a gate electrode (hereinafter, also referred to as the first gate electrode) of the drive transistor of the first pixel is disposed between the pixel electrode (hereinafter, also referred to as the first pixel electrode) of the current-driven light-emitting element of the first pixel and the pixel electrode (hereinafter, also referred to as the second pixel electrode) of the current-driven light-emitting element of the second pixel in a plan view of the main face of the substrate. As mentioned here, in the first active matrix substrate of the present invention, the position of the first pixel electrode is optimized; that is, the first pixel electrode is disposed at a position where the area overlapping the first gate electrode is small. At least part of the first gate electrode is disposed between the first pixel electrode and the second pixel electrode in a plan view of the main face of the substrate.

Another aspect of the present invention is an analog gradation-driving active matrix substrate (hereinafter, also referred to as the second active matrix substrate of the present invention), comprising multiple pixels each having a current-driven light-emitting element and a drive transistor, wherein the current-driven light-emitting element has a pixel electrode electrically coupled with the drive transistor; the drive transistor supplies a current to the current-driven light-emitting element through the pixel electrode; the multiple pixels include a first pixel; the pixel electrode (hereinafter, also referred to as the first pixel electrode) of the current-driven light-emitting element of the first pixel is provided with an opening at a position overlapping a gate electrode (hereinafter, also referred to as the first gate electrode) of the drive transistor of the first pixel. As mentioned here, the second active matrix substrate of the present invention is an active matrix substrate in which an opening is formed on the first pixel electrode.

The configuration of each of the first and second active matrix substrates of the present invention is not especially limited by other components as long as it essentially includes such components. The first active matrix substrate of the present invention and the second active matrix substrate of the present invention may be used in combination. In other words, in the first active matrix substrate of the present invention, the pixel electrode (first pixel electrode) of the first pixel may have an opening at the position overlapping the gate electrode (first gate electrode) of the first pixel. As a result, the Cad is further reduced.

Preferable modes of the first and second active matrix substrates of the present invention are mentioned in more detail below.

In one preferable mode of the first active matrix substrate of the present invention, the gate electrode of the first pixel does not overlap the pixel electrode (second pixel electrode) of the second pixel. Thereby, the Cad is reduced. Further, this preferable mode enables to prevent occurrence of signal noises and the like caused by influence of the second pixel electrode on the first gate electrode.

If the area of the pixel electrode is made larger in order to achieve better display performance, the first gate electrode is to overlap the first pixel electrode due to restriction in design terms. From the viewpoint of a much lower Cad, the first gate electrode is preferably disposed at the position where the area of the first gate electrode between the first pixel electrode and the second pixel electrode is maximal in a plan view of the main face of the substrate in the first active matrix substrate of the present invention.

In another preferable mode of the first active matrix substrate of the present invention, the first pixel is a pixel scanned after the second pixel, and the gate electrode of the first pixel overlaps the pixel electrode of the second pixel. In this case, the area where the first gate electrode overlaps the first pixel electrode is small and the Cad is low. On the other hand, the first gate electrode may disadvantageously be affected by the second pixel electrode. Nevertheless, substantially the same signal as a signal to be input to the first pixel electrode in terms of an image to be displayed has been already input to the second pixel electrode, and the first pixel is to be scanned in the next scanning. Thus, presumably, the influence of the second pixel electrode on the first gate electrode is negligibly small. Therefore, the second pixel electrode does not push up (or push down) the voltage of the first pixel electrode. In this mode, the first gate electrode may overlap the pixel electrode (nth pixel electrode) of the current-driven light-emitting element of a pixel other than the second pixel (for example, a pixel to be scanned after the first pixel) among the pixels adjacent to the first pixel in a plan view of the main face of the substrate. However, the nth pixel electrode has a greater influence on the first gate electrode than the second pixel has, and thus the first gate electrode preferably does not overlap the nth pixel electrode in a plan view of the main face of the substrate.

The closer the first gate electrode and the first pixel electrode are, the higher the Cad is. Thus, the Cad is particularly likely to be high in the case that the first gate electrode is included in the wiring layer directly under the first pixel electrode. As mentioned here, the present invention is particularly effective in the case that the gate electrode of the first pixel is included in the wiring layer directly under the pixel electrode of the first pixel.

If each pixel has a compensation circuit for compensating for variations in the threshold voltages of the drive transistors, many components are disposed on each pixel and layout flexibility in each pixel is poor. In other words, a more complicated layout in a pixel tends to cause larger area where the first pixel electrode overlaps the first gate electrode. As mentioned here, the present invention is particularly effective in the case that each of the multiple pixels has a compensation circuit for compensating for variations in the threshold voltages of the drive transistors of the respective pixels.

As is described in FIGS. 9 and 10, the gate electrode (gate electrode 102) of the drive transistor is formed in both the first wiring layer and the second wiring layer via a contact hole, in general, and the gate electrode transfers from the first wiring layer to the second wiring layer at the portion where the electrode overlaps components such as a scanning line formed in the first wiring layer. If the compensation circuit includes multiple transistors as in the organic EL display device shown in FIGS. 8 to 11, the pixel layout is complicated, and thus the gate electrode 102 is more likely to overlap the components such as scanning line formed in the first wiring layer. In this case, the area of the portion formed in the second wiring layer (wiring layer directly under the pixel electrode 103) of the gate electrode 102 is large and the Cad tends to be high. The present invention, however, is capable of reducing the Cad, and thus the problems in the above modes can be effectively solved. In other words, the present invention is particularly effective in the case that the compensation circuit includes multiple transistors.

Still another aspect of the present invention is an organic EL display device, comprising the first or second active matrix substrate of the present invention, wherein the current-driven light-emitting element of each of the multiple pixels is an organic EL element; and the pixel electrode of the current-driven light-emitting element of each of the multiple pixels is an anode or cathode of the organic EL element. In the first or second active matrix substrate of the present invention, the Cad is low and occurrence of the stepwise-response characteristics is suppressed. Therefore, an organic EL display device excellent in display performance can be achieved.

The aforementioned modes may be employed in appropriate combination as long as the combination is not beyond the spirit of the present invention.

Effects of the Invention

According to the present invention, an active matrix substrate and an organic EL display device can be provided in which reduction in the response rate of a current-driven light-emitting element is suppressed.

BRIEF DESCRIPTION OF THE DRAWINGS

FIG. 1 is a schematic plan view showing pixels of an organic EL display device of Embodiment 1.

FIG. 2 is a schematic plan view showing pixels of an organic EL display device of Embodiment 2.

FIG. 3 is a schematic plan view showing pixels of another organic EL display device of Embodiment 2.

FIG. 4 is a schematic plan view showing pixels of an organic EL display device of Embodiment 3.

FIG. 5 is a view wherein edge covers are additionally illustrated in FIG. 1.

FIG. 6 is a view wherein edge covers are additionally illustrated in FIG. 2.

FIG. 7 is a view wherein edge covers are additionally illustrated in FIG. 4.

FIG. 8 is a circuit diagram of a pixel of a conventional organic EL display device comprising a compensation circuit.
FIG. 9 is a schematic plan view showing a pixel of the conventional organic EL display device comprising a compensation circuit.
FIG. 10 is a schematic cross-sectional view along the X1-X2 line in FIG. 9.
FIG. 11 is a schematic plan view showing the positional pattern of the pixels shown in FIG. 9.
FIG. 12 is a graph showing the result of measuring the response characteristics of a conventional organic EL display device comprising a compensation circuit.
FIG. 13 is a graph showing the response waveform of a current obtained in the response-waveform simulation with a Cad of 0 fF.
FIG. 14 is a graph showing the response waveform of a current obtained in the response-waveform simulation with a Cad of 20 fF.
FIG. 15 is a graph showing the response waveform of a current obtained in the response-waveform simulation with a Cad of 60 fF.
FIG. 16 is a graph showing the relationship between the current supplied to the organic EL element and the Cad.
FIG. 17 is a timing chart of the first frame of the pixel shown in FIG. 8.
FIG. 18 is a schematic view showing the TFT characteristics of the transistor T4 (drive transistor).

MODES FOR CARRYING OUT THE INVENTION

Figure 1:
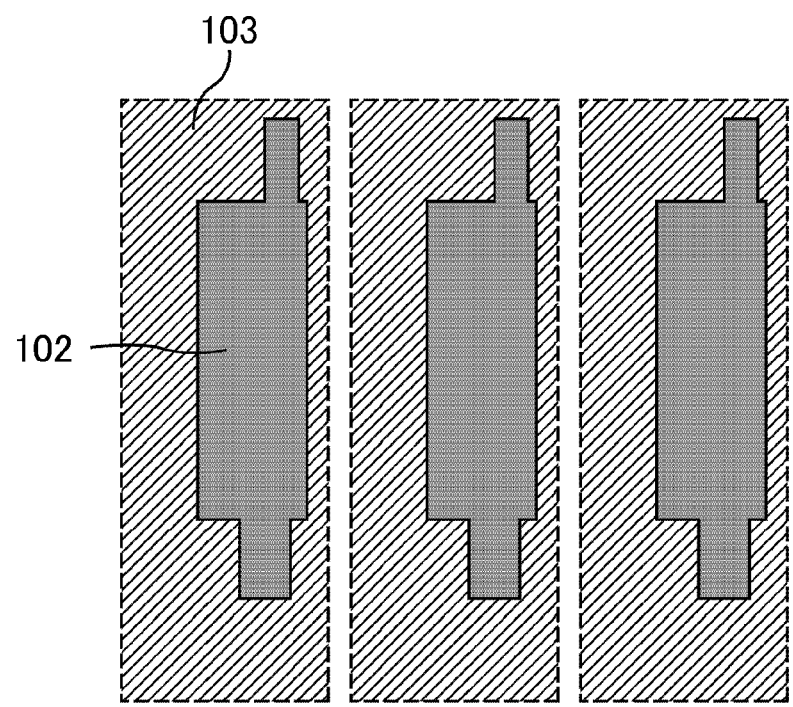
[FIG. 1]

The term "pixel electrode" herein means an electrode electrically coupled with a drain electrode of the drive transistor among the electrodes of the current-driven light-emitting element. In the case of the organic EL element, the pixel electrode may be an anode or may be a cathode.

The term "current-driven light-emitting element" herein means any element which is self-luminous depending on a supplied current, and is not particularly limited. Examples of those particularly effectively used in the present invention include flat-shaped current-driven light-emitting elements such as organic EL elements and inorganic EL elements.

The term "wiring layer directly under the pixel electrode" herein means the first wiring layer from the pixel electrode among the wiring layers which are disposed closer to the substrate than the pixel electrode is. In general, an interlayer insulating layer is disposed between the pixel electrode and the wiring layer. Thus, the "wiring layer directly under the pixel electrode" is also referred to as the "wiring layer adjacent to the pixel electrode via the interlayer insulating layer".

The present invention will be mentioned in more detail referring to the drawings in the following embodiments, but is not limited to these embodiments. The following embodiments will be described referring to the case where the present invention is applied to the organic EL display device shown in FIGS. 8 to 11 in order to simplify the description.

(Embodiment 1)
FIG. 1 is a schematic plan view showing pixels of an organic EL display device of Embodiment 1. The organic EL display device of Embodiment 1 is one produced by forming an opening within the pixel electrode 103 of the organic EL display device shown in FIGS. 8 to 11.

As shown in FIG. 1, in the organic EL display device of Embodiment 1, an opening is formed within the pixel electrode 103 at the position overlapping the gate electrode 102. Further, the opening has the same plan shape as the gate electrode 102. Thus, the pixel electrode 103 and the gate electrode 102 do not overlap with each other, so that the Cad is low as close as zero. As a result, occurrence of the stepwise responses is suppressed, and an organic EL display device excellent in display performance can be achieved.

Figure 2:
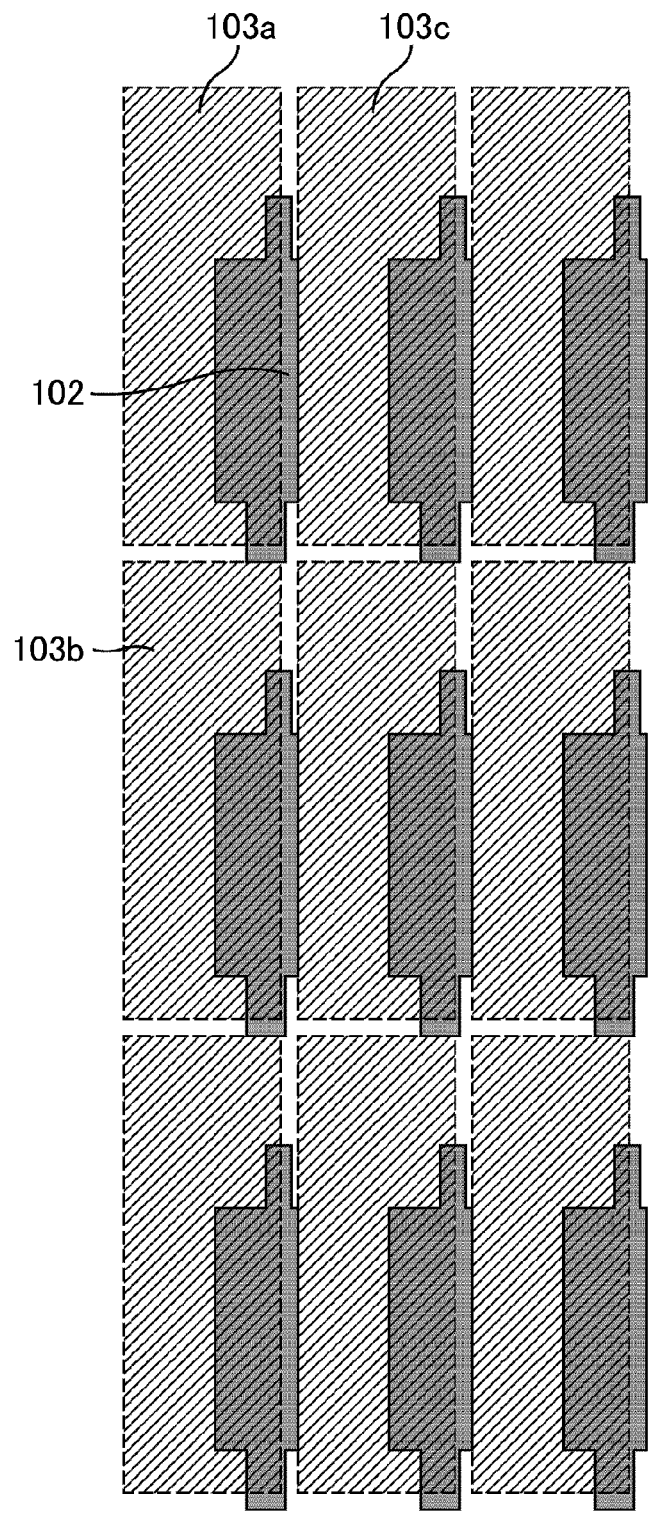
[FIG. 2]

(Embodiment 2)
FIG. 2 is a schematic plan view showing pixels of an organic EL display device of Embodiment 2. The organic EL display device of Embodiment 2 is one in which the position of the pixel electrode 103 is different from that in the organic EL display device of FIGS. 8 to 11. In FIG. 2, pixel electrodes 103a, 103b, and 103c each are a component having the same function as the pixel electrode 103 described referring to the drawings such as FIG. 1. They are given different symbols in order to illustrate that they are disposed on different pixels. The pixel electrode 103a is disposed on a pixel where the gate electrode 102 is disposed. The pixel electrode 103b is disposed on a pixel vertically adjacent to the pixel where the pixel electrode 103a is disposed in FIG. 2. The pixel electrode 103c is disposed on a pixel transversely adjacent to the pixel where the pixel electrode 103a is disposed in FIG. 2.

As shown in FIG. 2, the gate electrode 102 is disposed between the pixel electrodes 103a and 103b and between the pixel electrodes 103a and 103c in a plan view of the main face of the substrate. Thus, the Cad is low and occurrence of the stepwise-response characteristics is suppressed. Further, the gate electrode 102 does not overlap the pixel electrodes 103b and 103c. Thus, the gate electrode 102 is not affected by the pixel electrodes 103b and 103c, and problems such as occurrence of signal noises are prevented.

Figure 3:
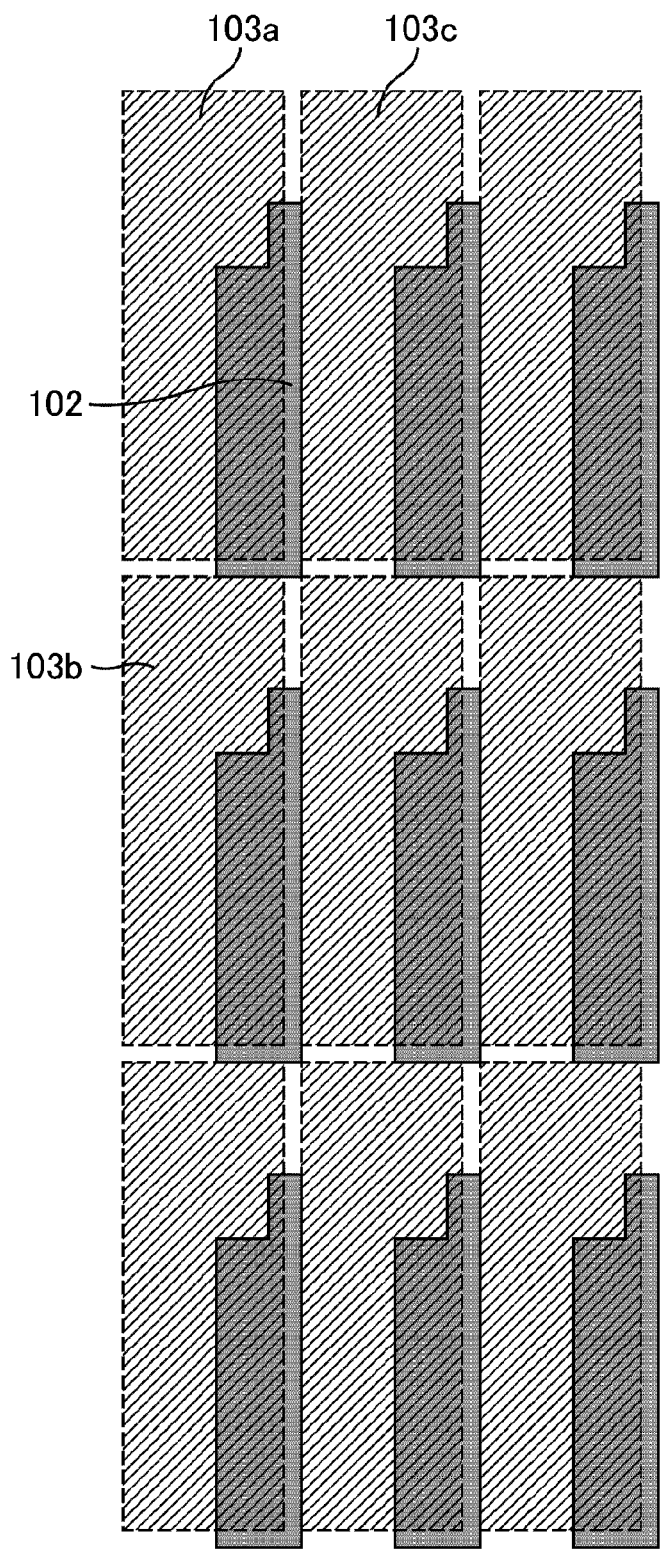
[FIG. 3]

The shape of the gate electrode 102 may be different from the plan shape shown in FIG. 2. FIG. 3 is a schematic plan view showing pixels of another organic EL display device of Embodiment 2. As shown in FIG. 3, the gate electrode 102 is preferably disposed such that edge portions of the gate electrode 102 correspond to edge portions of the pixel electrodes 103b and 103c in a plan view of the main face of the substrate in the case that the gate electrode 102 has the plan shape shown in FIG. 3. Thus, a better Cad-reducing effect is achieved.

Figure 4:
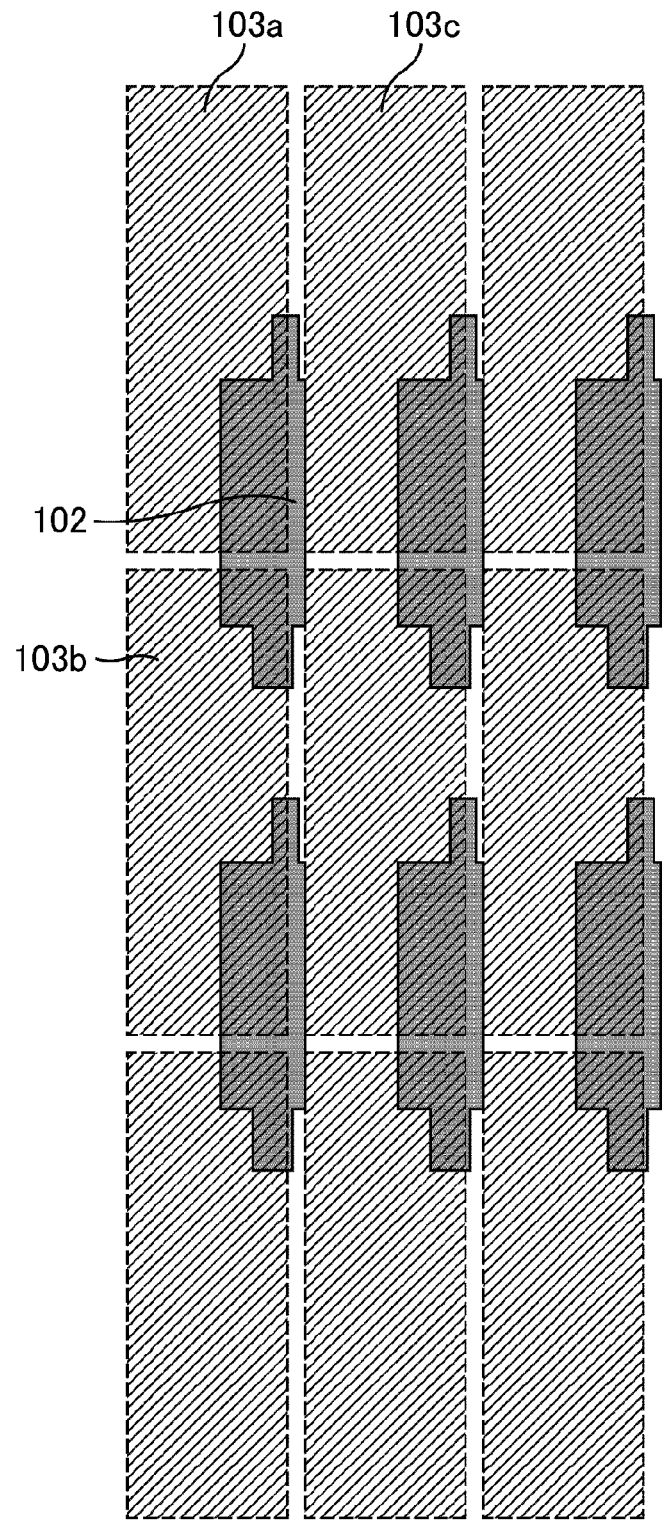
[FIG. 4]

(Embodiment 3)
FIG. 4 is a schematic plan view showing an organic EL display device of Embodiment 3. The organic EL display device of Embodiment 3 is one in which the position of the pixel electrode 103 is different from that in the organic EL display device of FIGS. 8 to 11. In FIG. 4, the pixel electrodes 103a, 103b, and 103c are in the same relationship as in Embodiment 2 described referring to FIG. 2. In the organic EL display device of Embodiment 3, the pixel with the pixel electrode 103b disposed thereon is to be scanned before the pixel with the pixel electrode 103a disposed thereon.

As shown in FIG. 4, the gate electrode 102 is disposed between the pixel electrodes 103a and 103b and between the pixel electrodes 103a and 103c in a plan view of the main face of the substrate. Thus, the Cad is low and occurrence of the stepwise-response characteristics is suppressed.

In Embodiment 3, the gate electrode 102 may problematically be affected by the pixel electrode 103b because the gate electrode 102 overlaps the pixel electrode 103b. Nevertheless, since the pixel (second pixel) with the pixel electrode 103b disposed thereon has been scanned immediately before the pixel (first pixel) with the pixel electrode 103a disposed thereon, substantially the same signal as a signal to be input to the pixel electrode 103a in terms of an image to be displayed has been already input to the pixel electrode 103b, and the first pixel is to be scanned in the next scanning. Thus, presumably, the influence of the pixel electrode 103b on the gate electrode 102 is negligibly small. Therefore, the voltage of the pixel electrode 103a is not pushed up (or pushed down) by the pixel electrode 103b.

Figure 5:
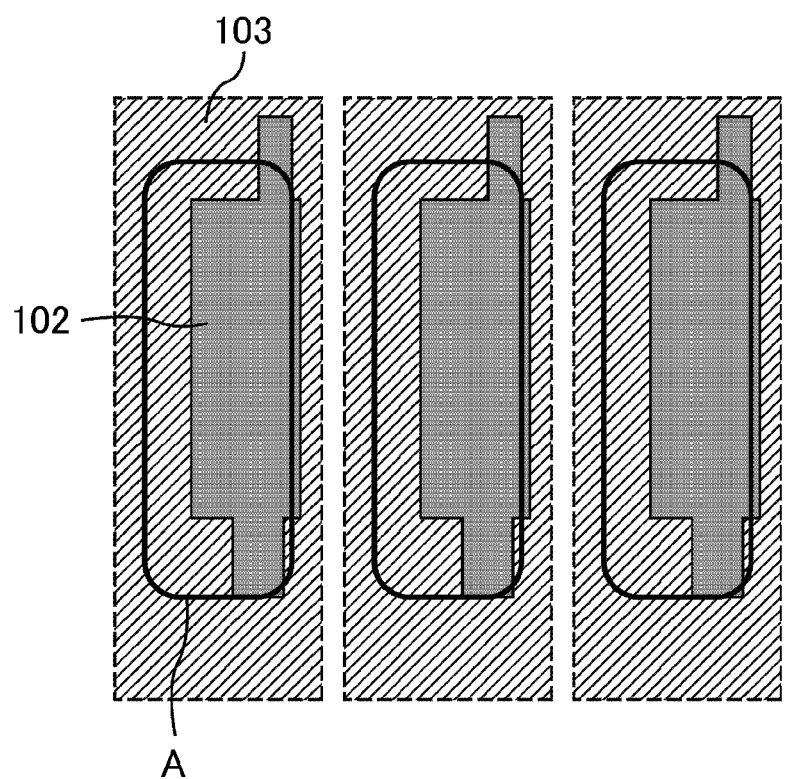
[FIG. 5]
Figure 6:
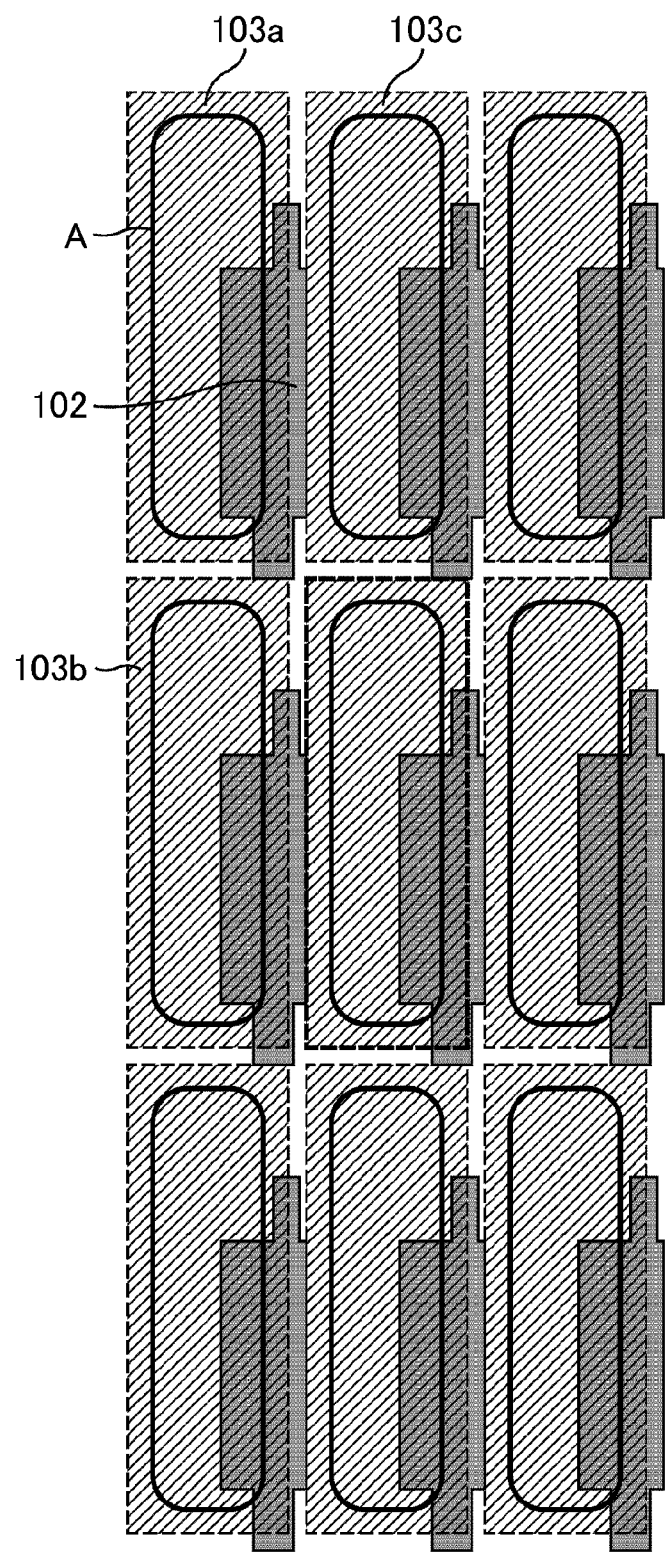
[FIG. 6]
Figure 7:
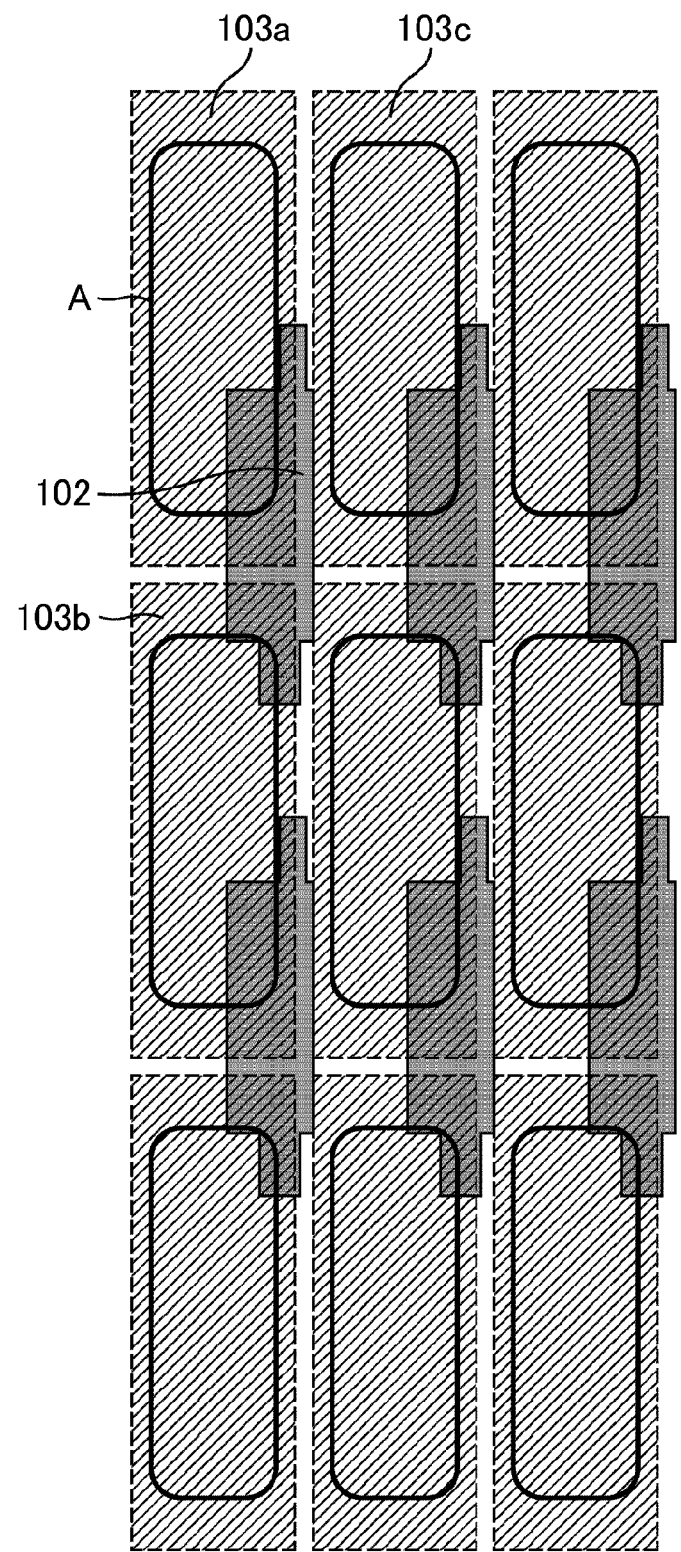
[FIG. 7]
Figure 8:
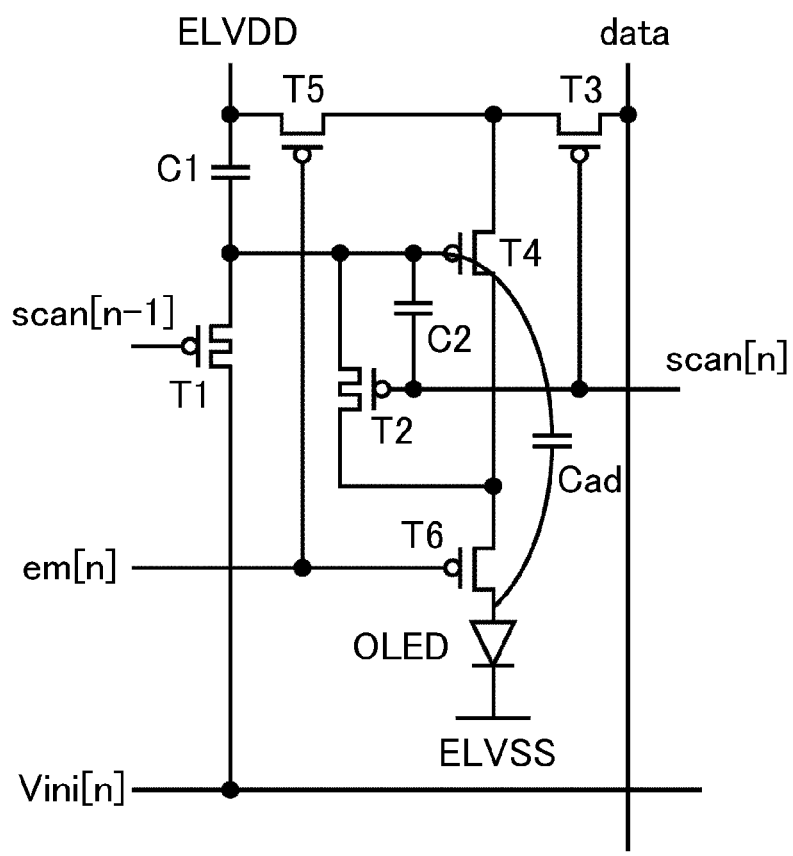
[FIG. 8]
Figure 9:
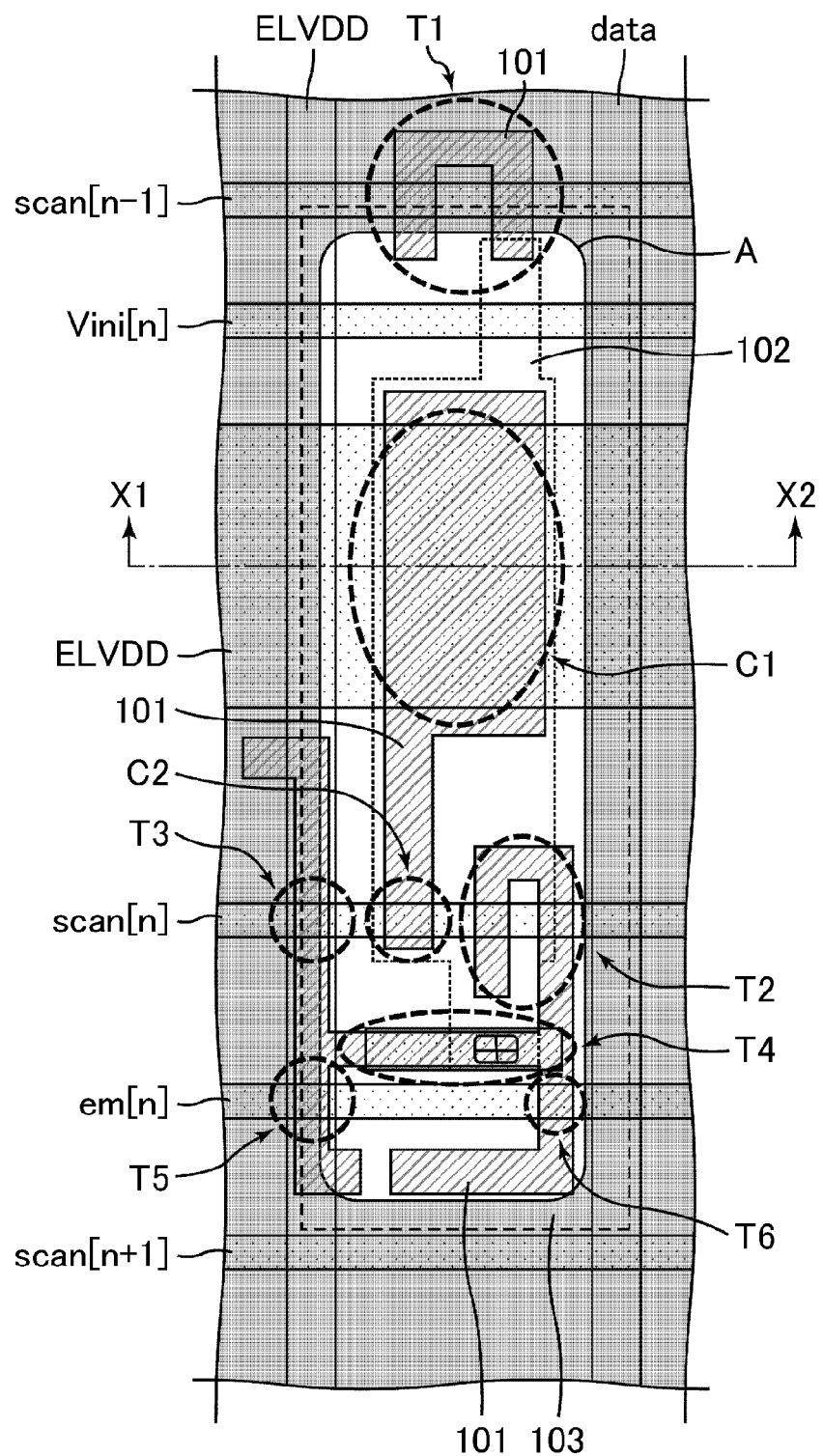
[FIG. 9]
Figure 10:
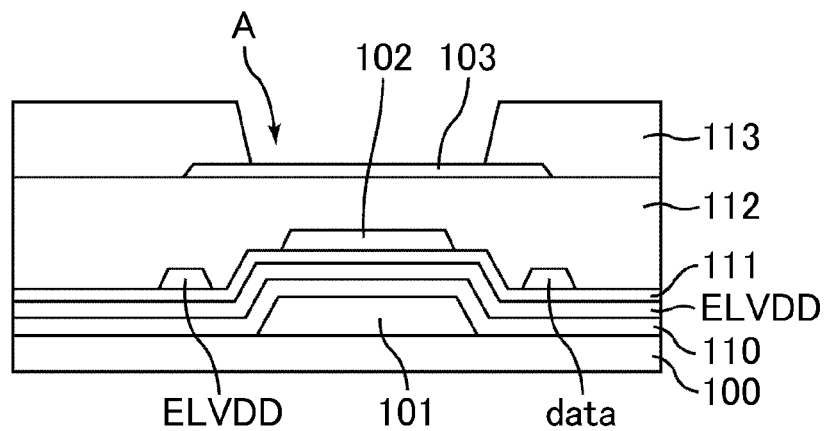
[FIG. 10]
Figure 11:
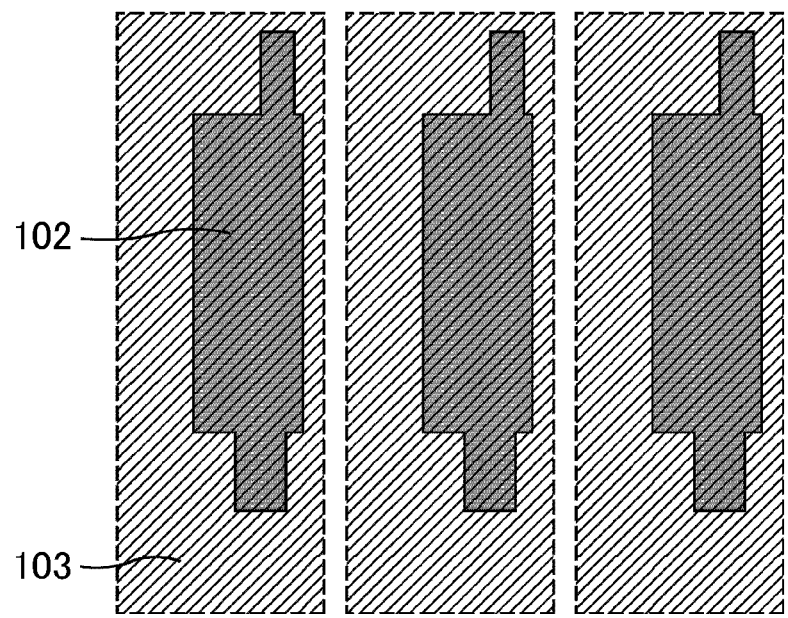
[FIG. 11]
Figure 12:
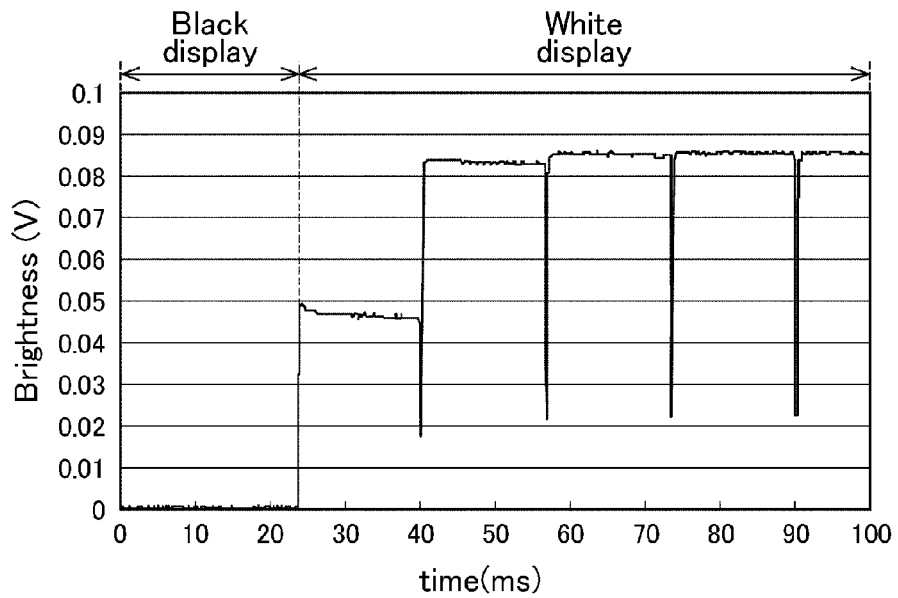
[FIG. 12]
Figure 13:
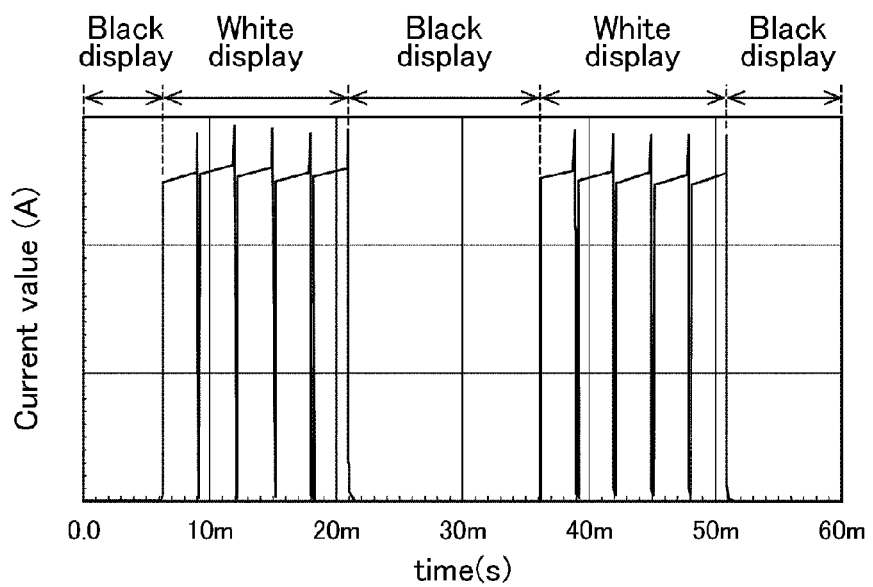
[FIG. 13]
Figure 14:
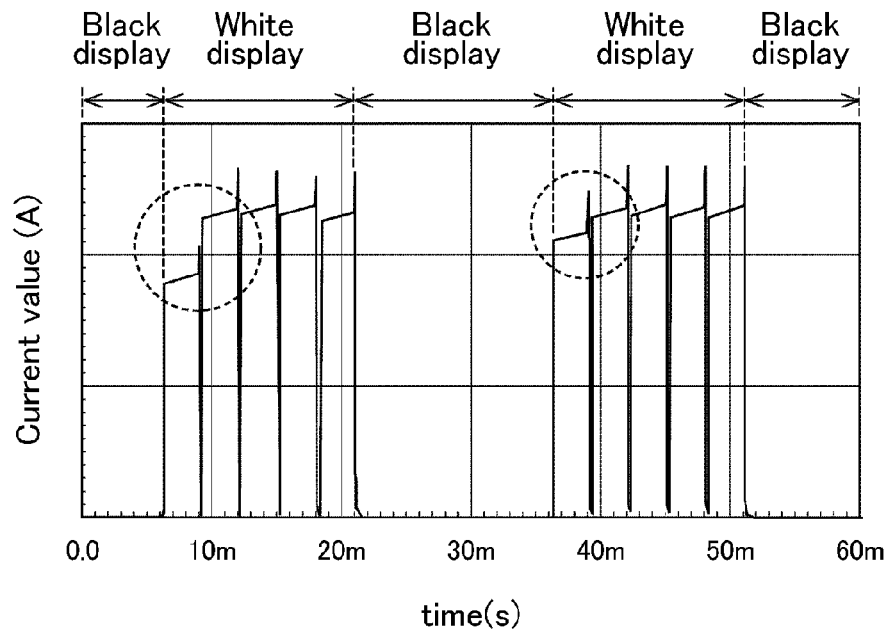
[FIG. 14]
Figure 15:
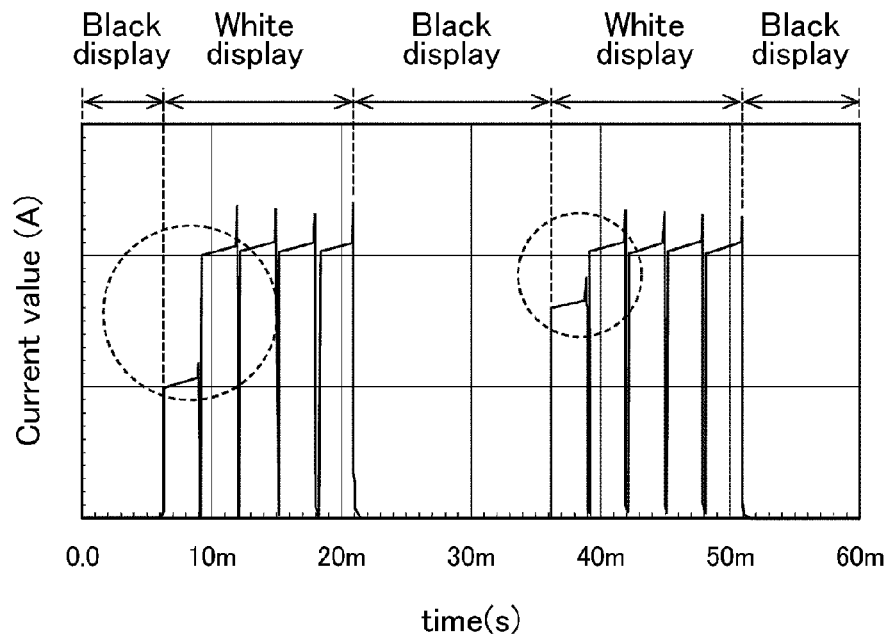
[FIG. 15]
Figure 16:
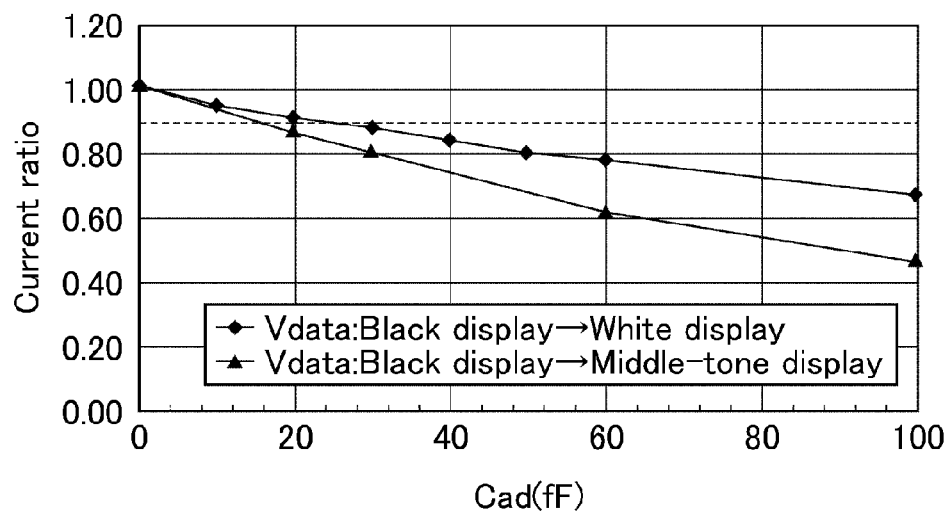
[FIG. 16]
Figure 17:
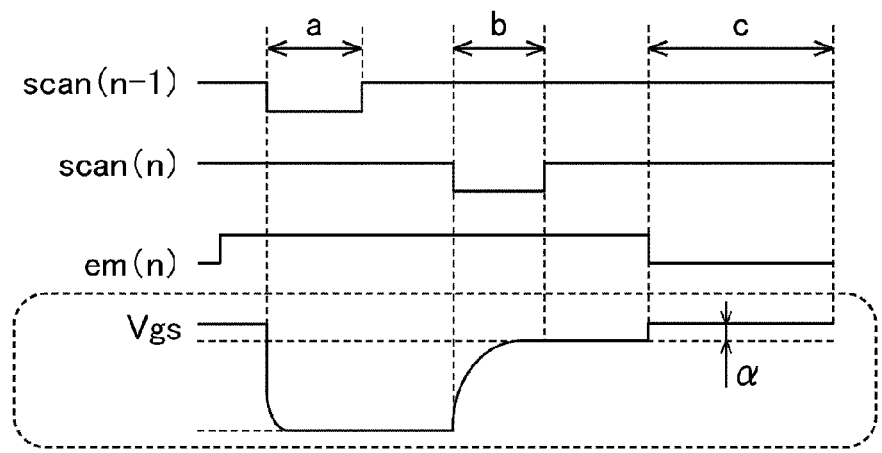
[FIG. 17]
Figure 18:
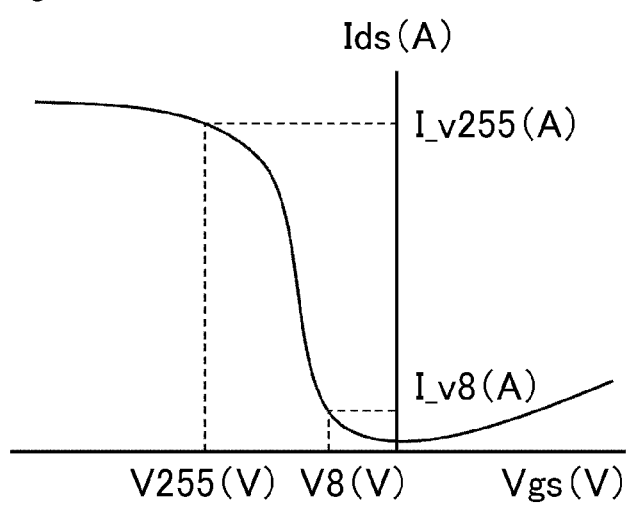
[FIG. 18]

Hereinabove, the present embodiments are described referring to FIGS. 1 to 4 in which only the gate electrode 102 and the pixel electrode 103 (pixel electrodes 103a, 103b, and 103c) are illustrated in order to make it easy to understand the features of the respective present embodiments. In addition, the organic EL display devices of the respective embodiments each comprise edge covers similarly to the organic EL display device shown in FIG. 9 and FIG. 10. FIG. 5 is a view wherein edge covers are additionally illustrated in FIG. 1, FIG. 6 is a view wherein edge covers are additionally illustrated in FIG. 2, and FIG. 7 is a view wherein edge covers are additionally illustrated in FIG. 4. In FIGS. 5 to 7, the regions where no edge cover formed thereon function as display regions A.

As shown in FIG. 5, in the organic EL display device of Embodiment 1, an opening is formed within the pixel electrode 103, and a region where no pixel electrode 103 is formed thereon exists within the display region A. Thus, the area (aperture ratio) of the display region A is substantially lower. Here, in the mode shown in FIG. 5, the opening is designed so as to maximize the Cad-reducing effect, and the opening within the pixel electrode 103 may be smaller than the gate electrode 102. Thus, reduction in the aperture ratio can be suppressed although the effect of reducing the Cad is also suppressed. As is apparent from the above description, the Cad-reducing effect and the aperture ratio are in trade-off relationship in the organic EL display device of Embodiment 1.

On the other hand, as shown in FIGS. 6 and 7, no opening is formed within the pixel electrode 103 (pixel electrodes 103a, 103b, and 103c) in the organic EL display devices of Embodiments 2 and 3. Thus, the aperture ratio does not decrease. From the viewpoint of further increasing the Cad-reducing effect, an opening may be formed within the pixel electrode 103 (pixel electrodes 103a, 103b, and 103c) at the portion overlapping the gate electrode 102 in the organic EL display devices of Embodiments 2 and 3 similarly to the organic EL display device of Embodiment 1.

The modes of the aforementioned embodiments may be employed in appropriate combination as long as the combination is not beyond the spirit of the present invention.

The present application claims priority to Patent Application No. 2009-156970 filed in Japan on Jul. 1, 2009 under the Paris Convention and provisions of national law in a designated State, the entire contents of which are hereby incorporated by reference.

Explanation of Symbols
T1, T2, T3, T4, T5, T6: transistor
C1, C2: capacitor
OLED: organic EL element
scan[n−1], scan[n], scan[n+1]: scanning line
Vini[n]: voltage-initializing line
em[n]: light emission controlling line
ELVDD, ELVSS: power-source line
data: signal line
100: substrate
101: semiconductor layer
102: gate electrode
103, 103a, 103b, 103c: pixel electrode (anode)
110, 111, 112: interlayer insulating layer
113: edge cover

The invention claimed is:

1. An analog gradation-driving active matrix substrate, comprising multiple pixels each including a current-driven light-emitting element and a drive transistor, the current-driven light-emitting element including a pixel electrode electrically coupled with the drive transistor,
a semiconductor layer, a first interlayer insulating layer, a first wiring layer, a second interlayer insulating layer, a second wiring layer, a third interlayer insulating layer, and the pixel electrode being disposed in the stated order,
a scanning line and a power-source line being provided in the first wiring layer, a signal line being provided in the second wiring layer, the drive transistor supplying a current to the current-driven light-emitting element through the pixel electrode, the multiple pixels including a first pixel, a second pixel, and a third pixel disposed adjacent to each other,
one portion of a gate electrode of the drive transistor of the first pixel being disposed between the pixel electrode of the current-driven light-emitting element of the first pixel and the pixel electrode of the current-driven light-emitting element of the second pixel and between the pixel electrode of the current-driven light-emitting element of the first pixel and the pixel electrode of the current-driven light-emitting element of the third pixel in a plan view of a main face of the substrate, wherein the one portion of the gate electrode does not overlap any pixel,
another portion of the gate electrode of the first pixel being transferred from the first wiring layer to the second wiring layer via a contact hole at a portion where the another portion of the gate electrode overlaps the scanning line of the first wiring layer and being included in the second wiring layer directly under the pixel electrode of the first pixel,
a capacitor being formed in a portion where the semiconductor layer overlaps the power-source line provided in the first wiring layer via the first interlayer insulating layer and a portion where the power-source line overlaps the another portion of the gate electrode of the second wiring layer via the second interlayer insulating layer,
the one portion of the gate electrode of the drive transistor of the first pixel being disposed such that edge portions of the one portion of the gate electrode correspond to edge portions of the pixel electrode of the current-driven light-emitting element of the third pixel.

2. The active matrix substrate according to claim 1, wherein the gate electrode of the first pixel does not overlap the pixel electrode of the second pixel.

3. The active matrix substrate according to claim 1, wherein the first pixel is a pixel to be scanned after the second pixel, and
the gate electrode of the first pixel overlaps the pixel electrode of the second pixel.

4. The active matrix substrate according to claim 1, wherein the pixel electrode of the first pixel is provided with an opening at a position overlapping the gate electrode of the first pixel.

5. An analog gradation-driving active matrix substrate, comprising multiple pixels each including a current-driven light-emitting element and a drive transistor, the current-driven light-emitting element including a pixel electrode electrically coupled with the drive transistor,
- a semiconductor layer, a first interlayer insulating layer, a first wiring layer, a second interlayer insulating layer, a second wiring layer, a third interlayer insulating layer, and the pixel electrode being disposed in the stated order,
- a scanning line and a power-source line being provided in the first wiring layer, a signal line being provided in the second wiring layer, the drive transistor supplying a current to the current-driven light-emitting element through the pixel electrode, the multiple pixels including a first pixel,
- the pixel electrode of the current-driven light-emitting element of the first pixel being provided with an opening at a position overlapping a gate electrode of the drive transistor of the first pixel,
- a first portion of the gate electrode of the first pixel being transferred from the first wiring layer to the second wiring layer via a contact hole at a portion where the first portion of the gate electrode overlaps the scanning line of the first wiring layer and being included in the second wiring layer directly under the pixel electrode of the first pixel,
- a capacitor being formed in a portion where the semiconductor layer overlaps the power-source line provided in the first wiring layer via the first interlayer insulating layer and a portion where the power-source line overlaps the first portion of the gate electrode of the second wiring layer via the second interlayer insulating layer,
- the multiple pixels including a second pixel and a third pixel disposed adjacent to the first pixel,
- a second portion of the gate electrode of the drive transistor of the first pixel being disposed between the pixel electrode of the current-driven light-emitting element of the first pixel and the pixel electrode of the current-driven light-emitting element of the second pixel and between the pixel electrode of the current-driven light-emitting element of the first pixel and the pixel electrode of the current-driven light-emitting element of the third pixel in a plan view of a main face of the substrate, wherein the second portion of the gate electrode does not overlap any pixel,
- the second portion of the gate electrode of the drive transistor of the first pixel being disposed such that edge portions of the second portion of the gate electrode correspond to edge portions of the pixel electrode of the current-driven light-emitting element of the third pixel.

6. The active matrix substrate according to claim 1,
- wherein each of the multiple pixels further includes a compensation circuit for compensating for variations in threshold voltages among the respective drive transistors of the pixels.

7. An organic EL display device, comprising the active matrix substrate according to claim 1,
- the current-driven light-emitting element of each of the multiple pixels being an organic EL element, and
- the pixel electrode of the current-driven light-emitting element of each of the multiple pixels being an anode or cathode of the organic EL element.

8. The active matrix substrate according to claim 1,
- wherein the gate electrode of the first pixel is disposed between adjacent pixels on a side along the scanning line in the plan view of the main face of the substrate.

9. The active matrix substrate according to claim 5,
- wherein each of the multiple pixels further includes a compensation circuit for compensating for variations in threshold voltages among the respective drive transistors of the pixels.

10. An organic EL display device, comprising the active matrix substrate according to claim 5,
- the current-driven light-emitting element of each of the multiple pixels being an organic EL element, and
- the pixel electrode of the current-driven light-emitting element of each of the multiple pixels being an anode or cathode of the organic EL element.

11. The active matrix substrate according to claim 5,
- wherein the gate electrode of the first pixel is disposed between adjacent pixels on a side along the scanning line in the plan view of the main face of the substrate.

12. The active matrix substrate according to claim 1,
- wherein the gate electrode has shape of a thin tip and a thick center part,
- a part of the thick center part is disposed between the pixel electrode of the current-driven light-emitting element of the first pixel and the pixel electrode of the current-driven light-emitting element of the second pixel.

13. The active matrix substrate according to claim 5,
- wherein the gate electrode has shape of a thin tip and a thick center part,
- a part of the thick center part is disposed between the pixel electrode of the current-driven light-emitting element of the first pixel and the pixel electrode of the current-driven light-emitting element of a second pixel adjacent to the first pixel.

* * * * *